United States Patent
Sato

[11] Patent Number: 5,918,148
[45] Date of Patent: Jun. 29, 1999

[54] METHOD FOR MANUFACTURING SEMICONDUCTOR DEVICE

[75] Inventor: Natsuki Sato, Tokyo, Japan

[73] Assignee: NEC Corporation, Tokyo, Japan

[21] Appl. No.: 08/936,605

[22] Filed: Sep. 24, 1997

[30] Foreign Application Priority Data

Sep. 30, 1996 [JP] Japan .................................. 8-258455

[51] Int. Cl.⁶ ............................................... H01L 21/44
[52] U.S. Cl. ........................ 438/669; 438/942; 438/945
[58] Field of Search ................................. 438/669, 942, 438/945, 670, 671

[56] References Cited

FOREIGN PATENT DOCUMENTS 3-137647  6/1991  Japan .
3-282545  12/1991  Japan .

*Primary Examiner*—John F. Niebling
*Assistant Examiner*—David A. Zarneke
*Attorney, Agent, or Firm*—Sughrue, Mion, Zinn, Macpeak & Seas, PLLC

[57] ABSTRACT

In a method for manufacturing a semiconductor device having a sharp step portion, a mask pattern to perform a patterning process of a photoresist layer is formed so that the dimension of the mask pattern is set to be larger than a design value of the corresponding wiring pattern only at a region where the thickness of the photoresist layer is different from that at a flat portion, and the mask pattern dimension at the flat portion which is away from the step portion is set to a design value of the corresponding wiring pattern. By using the mask pattern thus formed, the wiring dimension in the vicinity of the step portion can be prevented from becoming smaller than that at the flat portion under the condition that the wiring dimension of the design value can be obtained at the flat portion, so that the wirings can be formed according to the design value at any place containing the portion in the vicinity of the step portion and the flat portion. As a result, the reduction in product quality and yield due to the partial reduction in restoring level, a lag of timing, etc. can be avoided.

3 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and particularly to a method for manufacturing a semiconductor device having a sharp step portion on the surface thereof, in which method a wiring pattern is formed on the surface with little dimensional error even if it is formed in the neighborhood of the step portion.

2. Description of the Related Art

Following the recent compact design of integrated circuit devices to be formed on a semiconductor substrate, the microstructure and high integration of elements constituting the integrated circuit devices have been also required.

In such a device as a dynamic RAM (DRAM), a one-transistor and one-capacitor structure is used for a memory cell, and data reception/transmission is performed by charging/discharging charges into/from the capacitor. Therefore, the advancement of the compact design of elements would increase the probability that the amount of charges to be accumulated in the capacitor is reduced and some malfunction occurs in data reading/writing operation.

In order to solve the above problem, it is effective to increase the amount of charges to be accumulated in the capacitor, and thus there is generally used a method of increasing the height of charging electrodes and also increasing the surface area of the charging electrodes, thereby ensuring the increased amount of charges to be accumulated. As a result, the height of the memory cell portion and the height of the peripheral circuit portion are different from each other, so that a sharp step occurs at the boundary between the memory cell portion and the peripheral circuit portion. The sharp step thus formed makes it very difficult to perform a patterning process of wires which will be formed in a subsequent process.

FIGS. 1 and 2 show a conventional DRAM. Specifically, FIGS. 1 and 2 are cross-sectional views showing a series of a manufacturing process of a DRAM cell which comprises a MOS capacitor and a MOS transistor.

FIG. 1 shows a boundary portion between a memory cell portion and a peripheral circuit portion. As shown in FIG. 1, field oxide films 2 which serves as element isolating regions are formed on a P-type semiconductor substrate 1, and a gate electrode 4 and source/drain $N^+$-type diffusion layers 3 which constitute a transistor are formed in the element region of the peripheral circuit portion.

Likewise, each transistor of the memory cell portion also comprises a gate electrode 4 and source/drain $N^+$-type diffusion layers 3. The gate electrode 4 is connected to a word line 10 which is formed by patterning an upper wiring layer 7 later. One of the $N^+$-type diffusion layers 3 is connected to a bit line 6 while the other $N^+$-type diffusion layer 3 is connected to accumulating electrodes 5 for accumulating charges. A plate electrode which serves as a counter electrode to the accumulating electrode 5 is omitted from the figures. Thereafter, an interlayer film 12 is formed to establish insulation between layers, so that a large, sharp step is formed between the memory cell portion and the peripheral circuit portion.

Thereafter, an upper wiring layer 7 is deposited to form the word line, and then a photoresist is spin-coated to subject the upper wiring layer 7 to a patterning process. At this time, since the large step exists between the memory cell portion and the peripheral circuit portion, the thickness of the photoresist layer is non-uniform in the neighborhood of the step. That is, the photoresist layer is thinner (e.g., $T_0$, $T_1$) at the upper side in the vicinity of the step (at the memory cell portion side) than the other portion and thicker (e.g., $T_3$) at the lower side in the vicinity of the step (at the peripheral circuit portion side) than the other portion.

Thus, when the thickness of the photoresist layer is varied due to the step of the surface on which the photoresist layer is formed as shown in FIG. 1, the patterning process of the wirings causes dispersion of wiring dimension. That is, in an area where the thickness of the photoresist layer is equal to $T_2$, the patterning can be performed at the wiring dimension A (micrometer) which is equal to the design value (in this case, A micrometer). However, when the design dimension of all mask patterns for preparing photoresist patterns, the dimension $T_0$, $T_1$ or $T_3$ of the photoresist patterns of each of the upper and lower sides in the vicinity of the step portion is smaller than the design value A (micrometer) as shown in FIG. 1. That is, the following relationship is satisfied:

A (micrometer)>B (micrometer)>C(micrometer),

A (micrometer)>D (micrometer),

A: mask pattern dimension=design dimension,

A (micrometer) is obtained when the thickness of the photoresist layer is equal to $T_2$ (micrometer), B (micrometer) is obtained when the thickness of the photoresist layer is equal to $T_0$ (micrometer), C (micrometer) is obtained when the thickness of the photoresist layer is equal to $T_1$ (micrometer), and D (micrometer) is obtained when the thickness of the photoresist layer is equal to $T_3$ (micrometer).

In the above state, the upper wiring layer 7 is etched to form the word lines 10. FIG. 2 shows a state where the wiring layer 7 is etched and the patterned photoresist layer 9 is exfoliated. The dimension of the word lines 10 reflects the dimensional dispersion of the patterned photoresist layer 9, and thus the dimension of the word lines 10 in the vicinity of the step is smaller than the design dimension.

Furthermore, Japanese Patent Application Laid-open No. Hei-3-282545 discloses a semiconductor device having a groove portion 16 on the surface thereof. FIGS. 3 and 4 show this semiconductor device. When wirings 14 are patterned on a surface of a semiconductor device having a groove portion 16 as shown in FIG. 3, as the interval between a mask 17 and a photoresist layer is increased, the width of the photoresist pattern trends to be small. Therefore, an element forming pattern 20 of the mask 17 is designed so that it contains a rectangular portion 18 at both the end portions thereof and a curved or fat portion 19 of a large pattern width at the center portion thereof in accordance with the depth of the groove portion 16 as shown in FIG. 4.

Further, Japanese Patent Application Laid-open No. Hei-3-137647 discloses a semiconductor substrate 24 having steps as shown in FIG. 5. In this case, there is a large difference between the thickness 21 of the photoresist layer 23 at the upper side of the step and the thickness 22 of the photoresist layer 23 at the lower side of the step, and thus a dimensional difference of the patterned photoresist layer occurs. In the Japanese Patent Application laid-open No. Hei-3-137647, a countermeasure is taken by varying the correction amount of the mask dimension for patterning the photoresist layer between the pattern at the step upper side and the pattern at the step lower side.

The first problem of the above-mentioned art resides in that when a photoresist layer is patterned at the whole area under the condition that the wiring dimension which is coincident with the design value can be obtained at a flat portion, the wiring dimension in the vicinity of the step portion is smaller than that at the flat portion. This is because the thickness of the photoresist layer in the vicinity of the step portion is different from that at the flat portion.

The second problem of the above-mentioned art resides in that the resistance of wiring in the vicinity of the step portion increases to induce a lag of timing in the data reception/transmission or the like, so that the quality and yield of the memory cell device are reduced. This is because only the wirings in the vicinity of the step portion are formed so that the dimension thereof is smaller than the design value.

SUMMARY OF THE INVENTION

The present invention has been implemented to overcome the above problems, and has an object to provide a method for manufacturing a semiconductor device, which can form wirings in the vicinity of a step portion simultaneously with wirings at a flat portion so that the dimension of the wirings in the vicinity of the step portion is substantially coincident with the design dimension, that is, the dimension at the flat portion.

In order to attain the above object, a method for manufacturing a semiconductor device according to the present invention is characterized in that the dimension of a mask for forming a photoresist pattern to form wirings on at least one of the upper and lower sides in the vicinity of a sharp step portion of the semiconductor device is set to be larger than a design value, and the dimension of the mask for forming a photoresist pattern to form wirings on a flat portion which is away from the step portion is set to the design value, thereby patterning a photoresist layer by using the mask.

That is, there is provided a method for manufacturing a semiconductor device having a step portion at which discontinuity in height is formed by upper and lower portions adjacent to each other, and wirings which are formed on a surface of an area containing vicinity of the step portion and a flat portion positioned away from the step portion, comprising the steps of:

forming a wiring layer on the surface of the area containing vicinity of the step portion and the flat portion;

forming a photoresist layer on the wiring layer;

patterning the photoresist layer by using a photomask to form a photoresist pattern corresponding to the wirings; and etching the wiring layer by using the photoresist pattern to remove an exposed portion of the wiring layer and form the wirings, wherein the photomask has a first mask pattern corresponding to the photoresist pattern formed in the vicinity of the step portion at at least one of upper and lower portion sides of the step portion and a second mask pattern corresponding to the photoresist pattern formed in the flat portion, the first mask pattern having a dimension larger than a corresponding value of a predetermined dimension of corresponding wirings, the second mask pattern having a dimension equal to a corresponding value of a predetermined dimension of corresponding wirings.

A thickness of the photoresist layer in the vicinity of the step portion at the upper portion side of the step portion may be smaller than that in the flat portion while a thickness of the photoresist layer in the vicinity of the step portion at the lower portion side of the step portion is larger than that in the flat portion.

It is preferable that a value of a resolution limit sensitivity of a photoresist in the thickness of the photoresist layer in the vicinity of the step portion at the upper and lower portion sides of the step portion is smaller than that of a photoresist in the thickness of the photoresist layer in the flat portion.

According to the present invention, under the condition that the wiring dimension as designed can be obtained at the flat portion, the wiring dimension which is substantially equal to the design dimension can be obtained even at a place in the vicinity of the step portion at which the thickness of the photoresist layer is different from that at the flat portion. This is because the dimension of the mask pattern is set to be larger than the design value of the wirings at only a place in the vicinity of the step portion where the photoresist layer thickness is different from that of the flat portion, so that the dimension of wirings thus formed is substantially equal to the design value at any place.

Further, the wiring dimension can be finally set according to the design dimension, so that such disadvantages as deterioration of product quality such as partial reduction of restore level, a lag of timing, etc., and reduction in yield can be avoided. This is because the wiring dimension can be set according to the design value at any place containing the portion adjacent to the step portion and the flat portion, so that no breaking of wirings and no short circuit occur, and there is no dispersion in the wiring resistance.

DETAILED DESCRIPTION OF THE PREFERRED EMBODIMENT

A preferred embodiment according to the present invention will be described hereunder with reference to the accompanying drawings.

Figure 6:
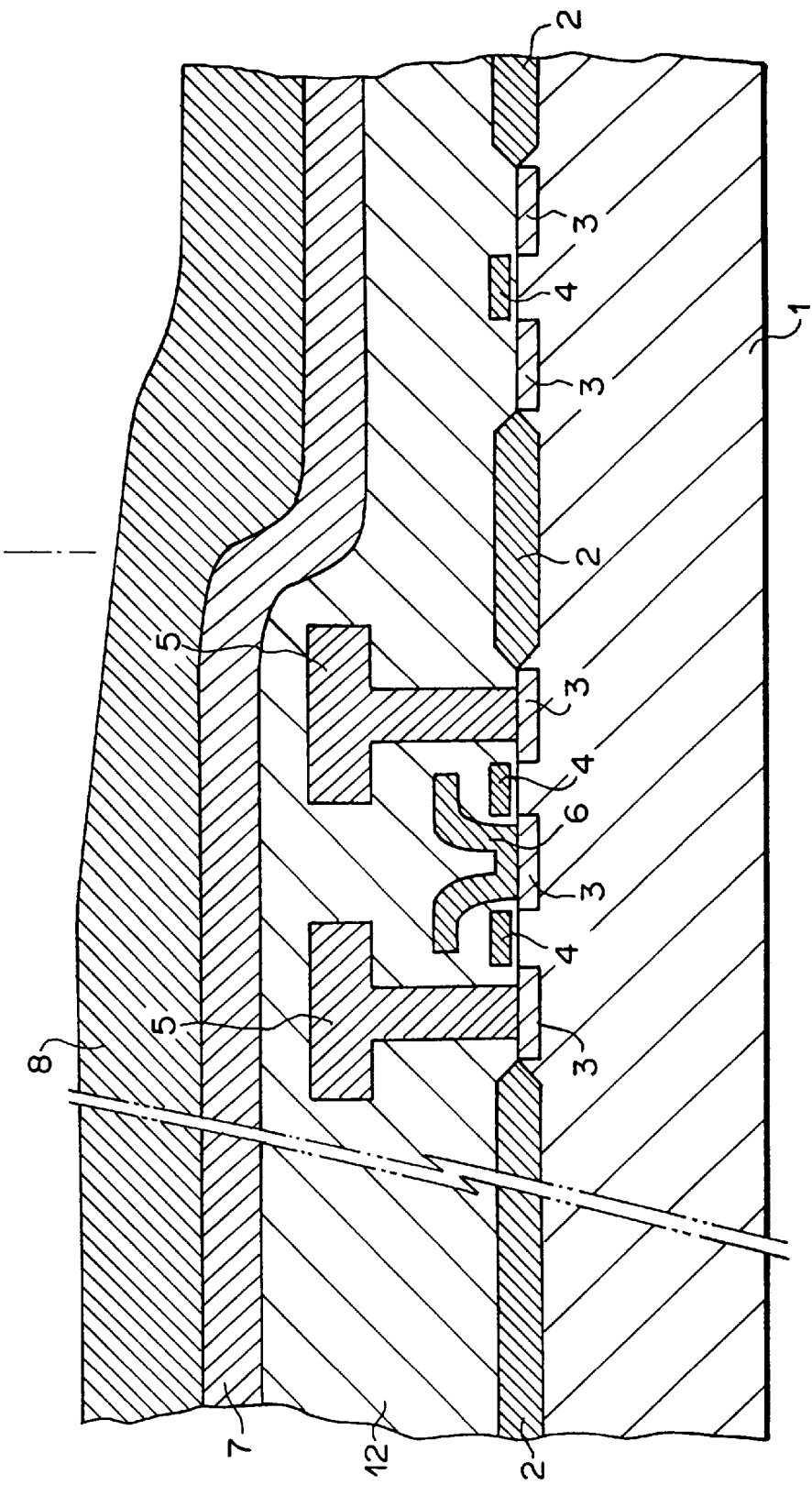
FIG. 6 is a cross-sectional view of a semiconductor chip to show a manufacturing process according to the present invention.
Figure 7:
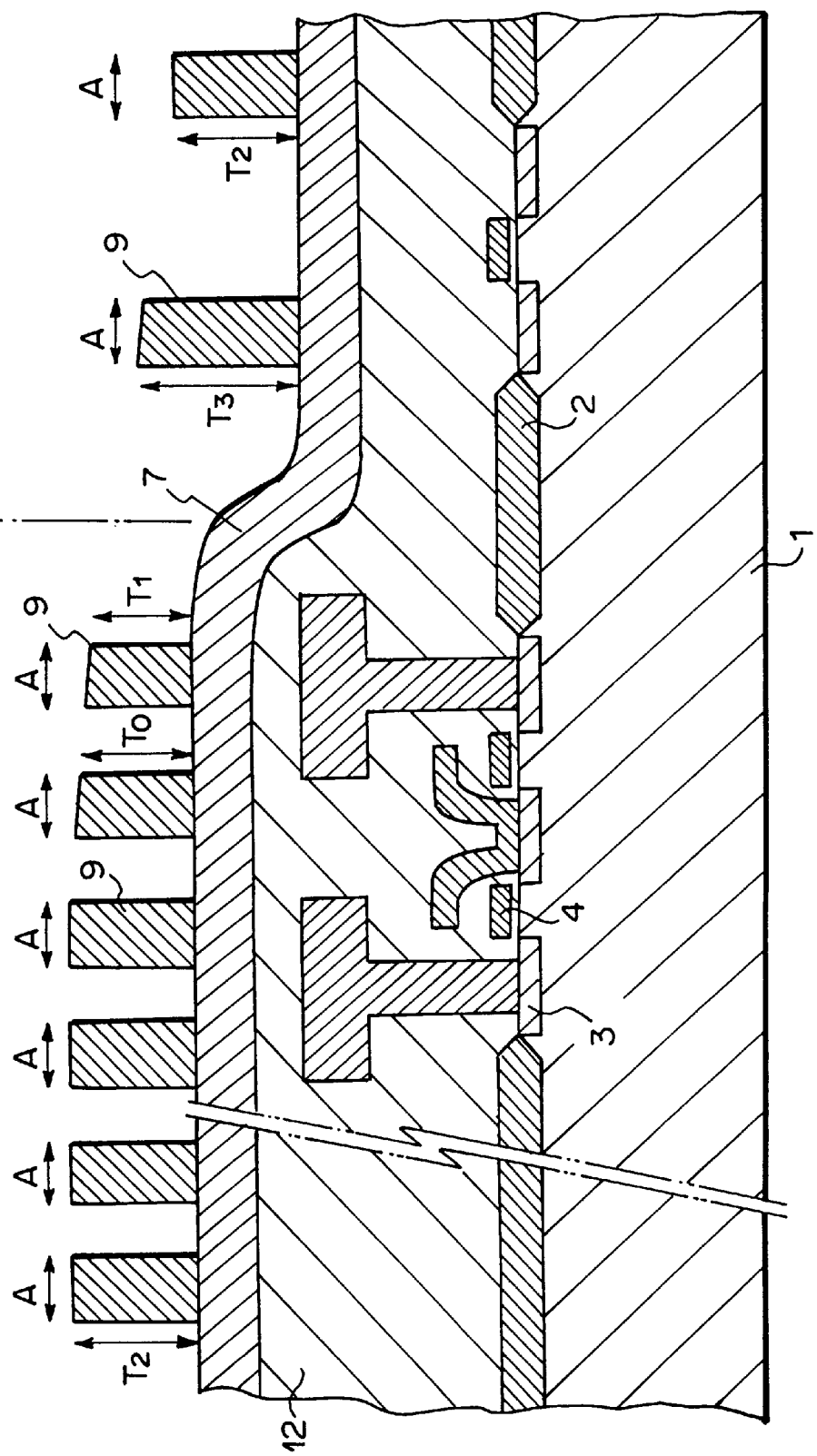
FIG. 7 is a cross-sectional view of a semiconductor chip to show the manufacturing process according to the present invention.
Figure 8:
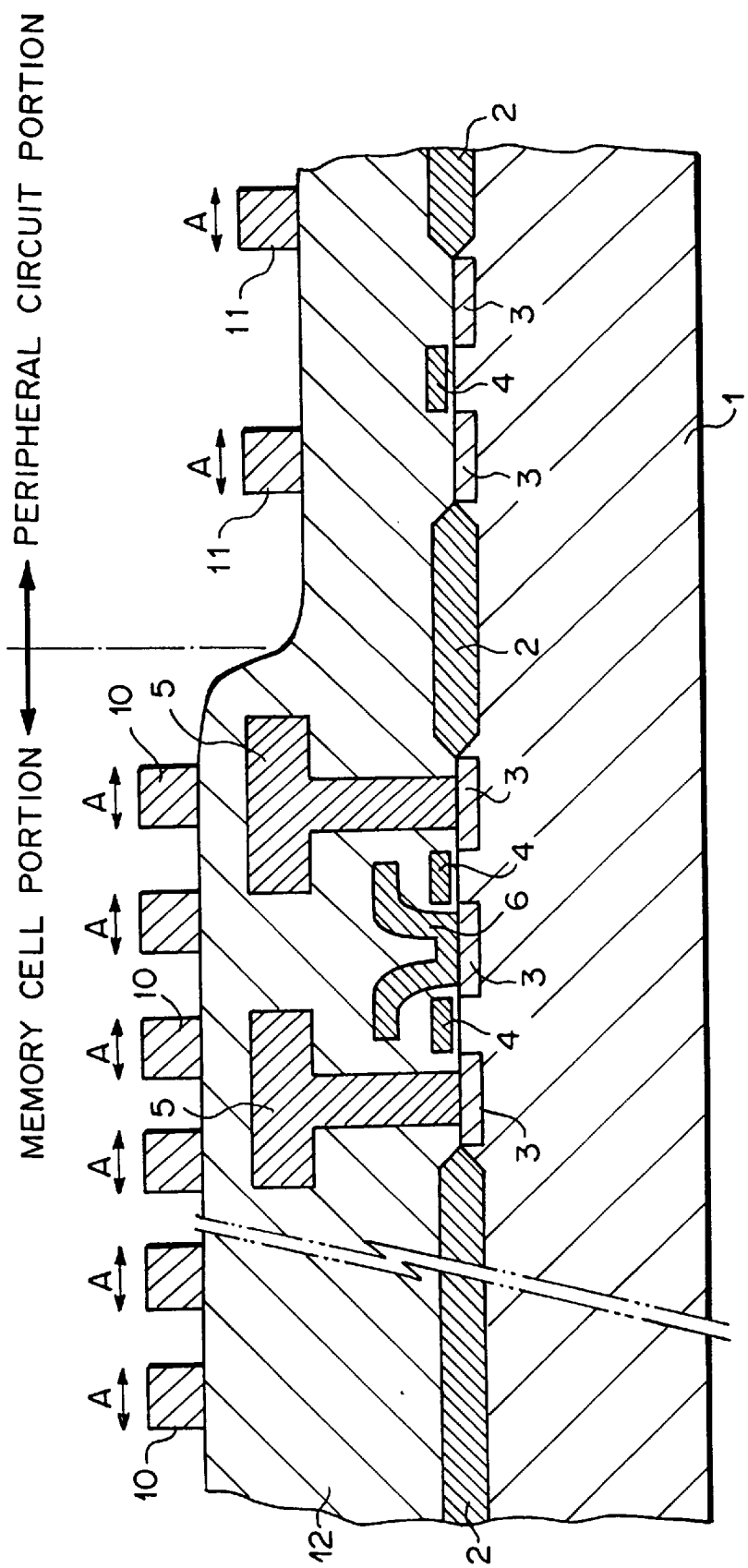
FIG. 8 is a cross-sectional view of a semiconductor chip to show the manufacturing process according to the present invention.

FIGS. 6 to 8 are cross-sectional views showing a series of a semiconductor device manufacturing method according to the present invention. Particularly, FIG. 8 shows a semiconductor device which is manufactured by the method of the present invention by exemplifying a dynamic RAM cell which comprises a MOS capacitor and a MOS transistor.

First, as shown in FIG. 6, field oxide films 2 which serves as element isolating regions are formed at a thickness of 4000 angstroms on a p-type semiconductor (Si) substrate 1, and a gate electrode 4 and source/drain $n^+$-type diffusion layers 3 which constitute a transistor are formed in an element region of the peripheral circuit portion.

The gate electrode 4 is formed of polysilicon and has a thickness of 2000 angstroms which is doped with phosphorus of about 2E20 cm$^{-3}$, and the gate length is set to 0.6 micrometer. The depth of the n$^+$-type diffusion layers 3 is set to about 0.2 micrometer.

Likewise, each transistor of the memory cell portion also comprises a gate electrode 4 and source/drain n$^+$-type diffusion layers 3, which are substantially the same as those of the peripheral circuit portion. However, the gate length of the memory cell portion is set to 0.4 micrometer. The gate electrodes 4 of the memory cell portion are connected to word lines 10 which are formed by patterning an upper wiring layer 7.

One of the n$^+$-type diffusion layers 3 of the transistor of the memory cell portion is connected to a bit line 6 while the other n$^+$-type diffusion layer 3 is connected to accumulating electrode 5 for accumulating charges. A plate electrode serving as a counter electrode to the accumulating electrode 5 is omitted from the illustration. The bit line 6 is formed of tungsten silicide and has a thickness of 3000 angstroms.

Thereafter, an interlayer film 12 is formed by using a BPSG film to establish insulation between the layers. This process is performed by depositing the BPSG film at a thickness of 6000 angstroms by the CVD method, and conducting a heat treatment at 900° C. for about 20 minutes to thermally reflow the BPSG film so that the surface thereof is smoothened as much as possible. As a result, there is formed a large step between the memory cell portion and the peripheral circuit portion.

Thereafter, the upper wiring layer 7 is deposited to form the word lines. In this embodiment, aluminum is deposited at a thickness of 5000 angstroms as the upper wiring layer 7. Further, photoresist is spin-coated to form a photoresist layer 8 which is used to conduct a patterning treatment on the upper wiring layer 7. In this case, the photoresist layer 8 is formed so that the thickness thereof is equal to 11200 angstroms at a flat portion. In this case, since a large step portion is formed at the boundary between the memory cell portion and the peripheral circuit portion, the thickness of the photoresist layer 8 is not uniform at the step portion and the vicinity thereof. That is, the photoresist layer 8 at the upper side in the vicinity of the step portion (at the memory cell portion side) becomes thinner than that at the flat portion and the thickness thereof is equal to for example about 10600 angstroms in this embodiment while the photoresist layer 8 at the lower side in the vicinity of the step portion (at the peripheral circuit portion side) is thicker than that at the flat portion and the thickness thereof is equal to for example about 11800 angstroms.

Figure 9:
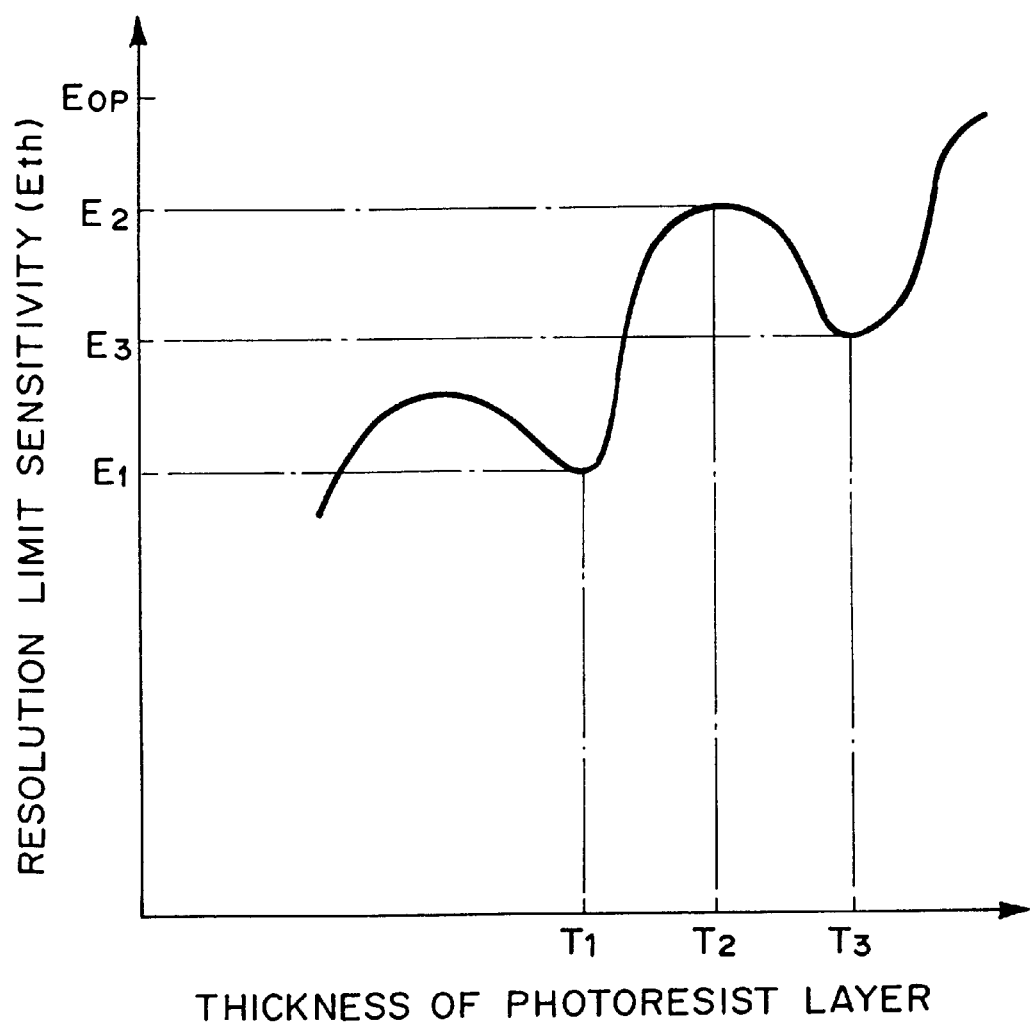
FIG. 9 is a diagram showing a sensitivity curve of a photoresist.

Here, the relationship between the thickness of the photoresist layer and the resolution limit sensitivity (Eth) is shown in FIG. 9. Here, the resolution limit sensitivity (Eth) means the minimum exposure time which permits a patterning (resolving) process on the photoresist layer having the thickness. The characteristic shown in FIG. 9 is generally called "swing curve".

In the case of materials having such a characteristic as shown in FIG. 9, the thickness $T_2$ (in this embodiment, 11200 angstroms) has been selected as the optimum thickness of the photoresist layer. When some dispersion occurs in the thickness of the photoresist layer, the thickness varies for example to $T_1$ or $T_3$ as mentioned in the above, and the resolution limit sensitivity (Eth) varies to $E_1$ for $T_1$ and $E_3$ for $T_3$ respectively. In any case, the resolution limit sensi- tivity is lower than $E_2$. That is, in the case of FIG. 9, the following inequality is satisfied:

$E_2 > E_3 > E_1$

In this embodiment, $T_1 = 10600$ angstroms→ $E_1$
$T_2 = 11200$ angstroms→ $E_2$
$T_3 = 11800$ angstroms→ $E_3$ That is, the thickness is varied so that the sensitivity is enhanced to a higher value than that in the case of the thickness $T_2$ (11200 angstroms) corresponding to $E_2$, that is, so that Eth is reduced. Therefore, there can be suppressed the reduction of yield on the basis of a pattern short which is caused by the resolution failure due to the variation of the thickness of the photoresist layer. Therefore, the optimum thickness $T_2$ is selected, and the optimum exposure time Eop is set to 1.2 times to 1.5 times of $E_2$ to perform the patterning process.

Figure 1:
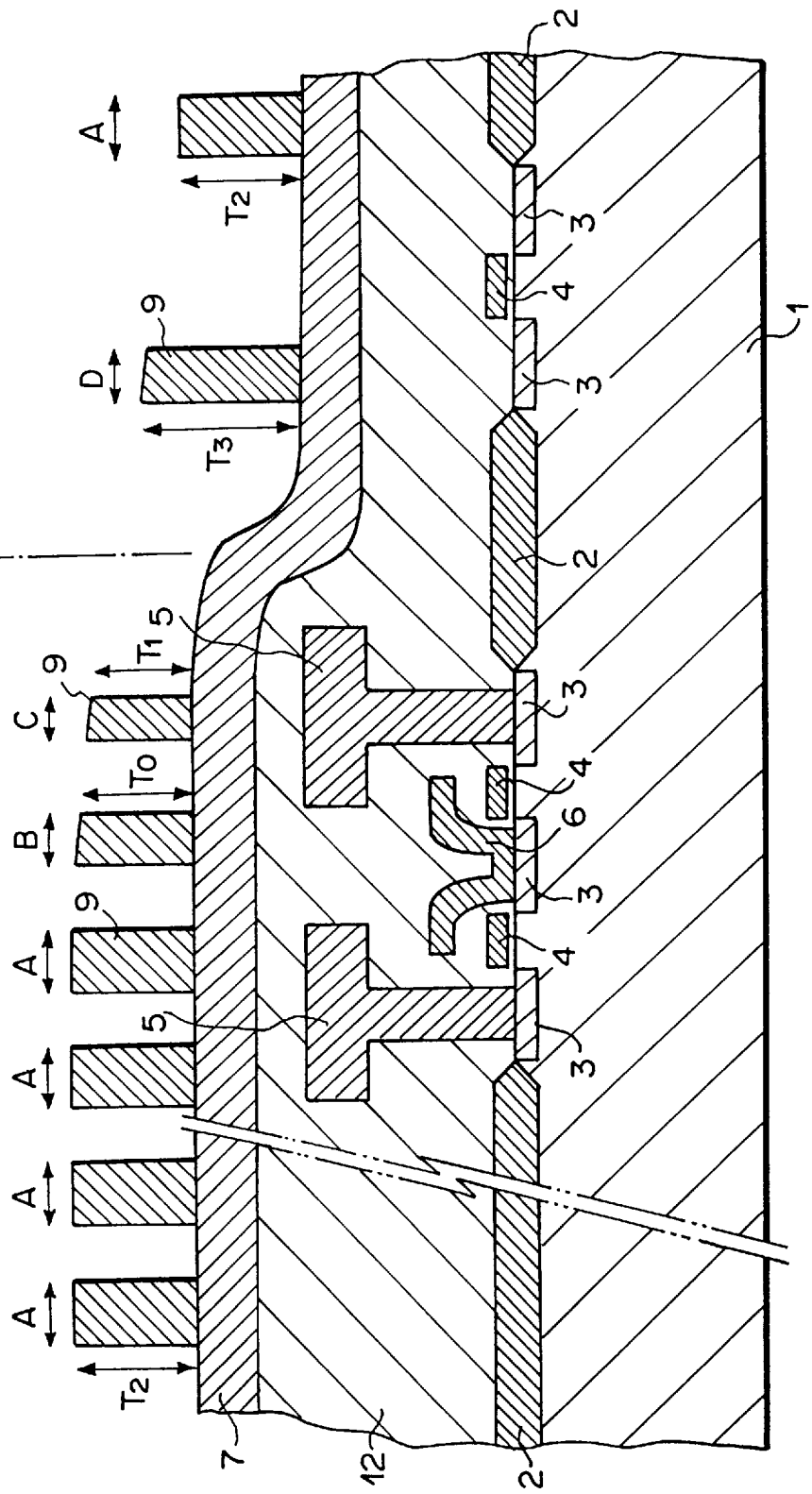
FIG. 1 is a cross-sectional view of a semiconductor chip to show a first conventional manufacturing process.
Figure 2:
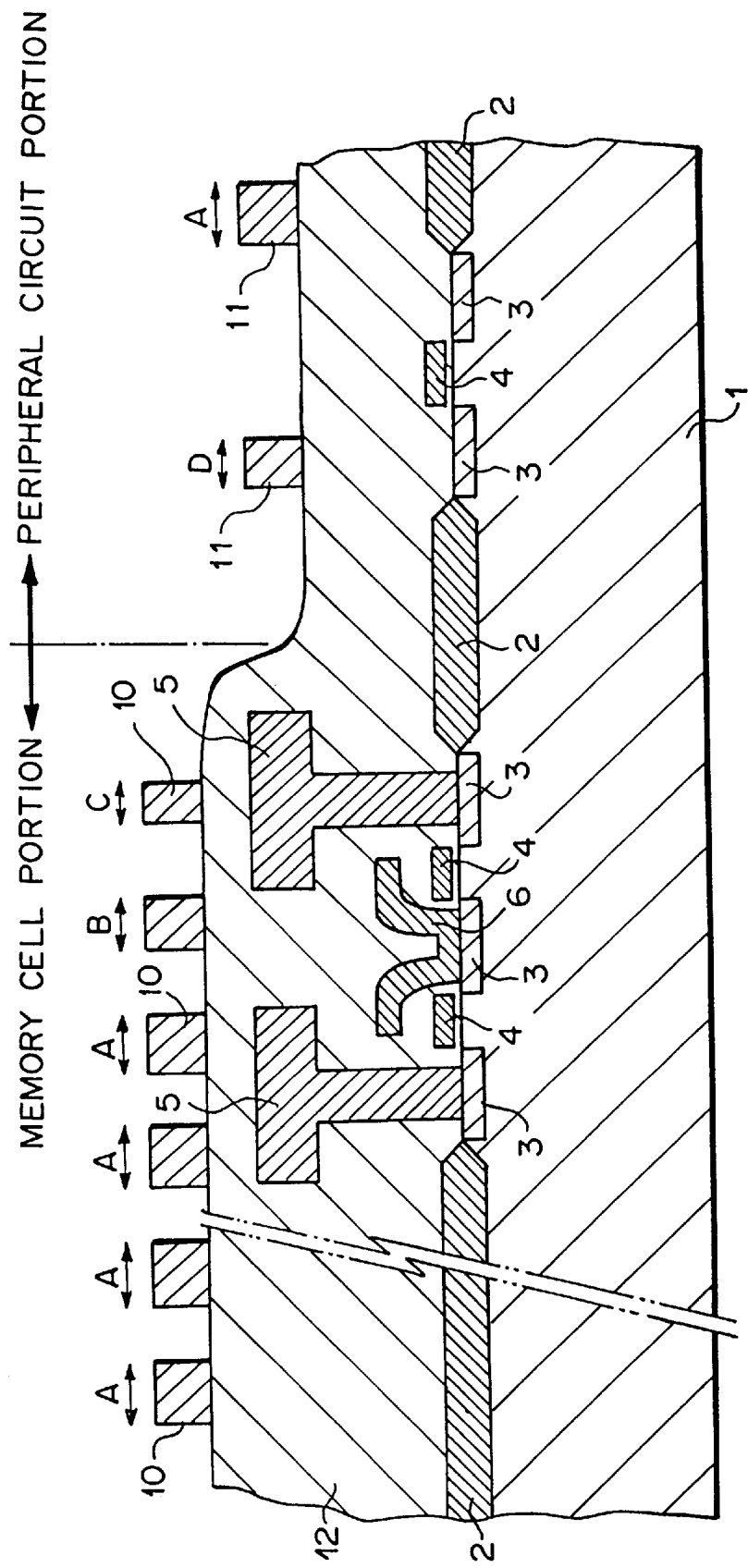
FIG. 2 is a cross-sectional view of a semiconductor chip to show the first conventional manufacturing process.
Figure 3:
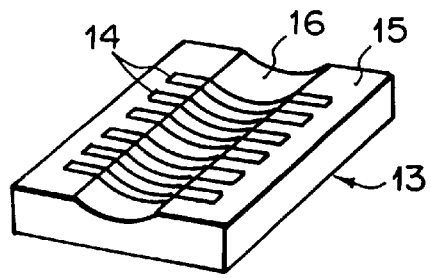
FIG. 3 is a perspective view showing a second conventional manufacturing process.
Figure 4:
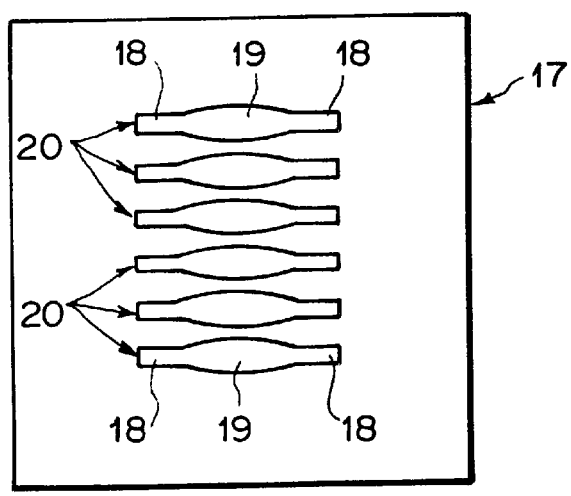
FIG. 4 is a plan view showing the second conventional manufacturing process.
Figure 5:
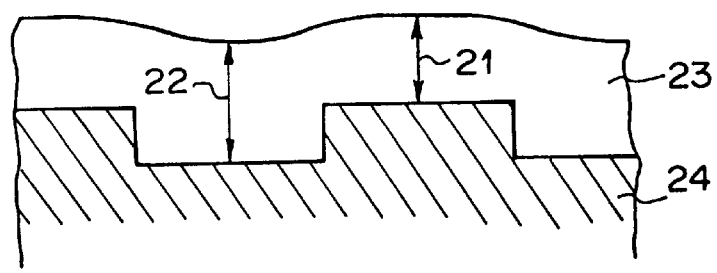
FIG. 5 is a cross-sectional view showing a step structure of a semiconductor substrate of a third conventional manufacturing process.

The photoresist has the above characteristic. Therefore, when the thickness of the photoresist layer is varied due to the step portion as shown in FIG. 6, the conventional patterning process without using the present invention causes dispersion in the wiring dimension as mentioned in the above with reference to FIGS. 1 and 2.

That is, Eth is lowered at both the upper side of the step portion where the photoresist layer is thinner and the lower side of the step portion where the photoresist layer is thicker, and it is shifted to $E_1$ and $E_3$ respectively. Therefore, the sensitivity is enhanced, and the wiring dimension is made smaller than the design dimension at both the upper and lower sides in the vicinity of the step portion.

As a result, in the case where the design dimension A of the wirings is set to 0.6 micrometer, if the present invention is not applied, the wiring dimension obtained in the case of the thickness $T_1$ (10600 angstroms) is equal to about 0.5 micrometer, and the wiring dimension obtained in the case of the thickness $T_3$ (11800 angstroms) is equal to about 0.55 micrometer. Accordingly, in this embodiment, the pattern size of the mask is designed to be larger (thicker) by 0.1 micrometer than the design dimension A at the place where the thickness of the photoresist layer is equal to $T_1$ at the upper side in the vicinity of the step portion, and also to be larger (thicker) by 0.05 micrometer than the design dimension A at the place where the thickness of the photoresist layer is equal to $T_3$ at the lower side in the vicinity of the step portion.

In this embodiment, the thickness $T_0$ is less than $T_2$ and larger than $T_1$. Therefore, the pattern size of the mask at the place where the thickness of the photoresist layer is equal to $T_0$ is designed to be larger (thicker) than that of the flat portion where the thickness of the photoresist layer is equal to $T_2$ and smaller (thinner) than that of the place where the thickness of the photoresist layer is equal to $T_1$ at the upper side in the vicinity of the step portion.

As described in the above, a compensation amount for the pattern size of the mask in the vicinity of the step portion including the above place where the thickness of the photoresist layer is equal to $T_0$, $T_1$, $T_3$ can be predetermined by experimentations.

The result obtained when the exposure was performed by using the exposure time Eop is shown in FIG. 7. By applying the present invention, all the wirings were patterned substantially at the design dimension A of 0.6 micrometer even when the thickness (dimension) of the patterned photoresist layer 9 was thinner ($T_0$, $T_1 = 10600$ angstroms) or thicker ($T_3 = 11800$ angstroms) than that ($T_2 = 11200$ angstroms) at the flat portion.

In this state, the upper wiring layer 7 is etched to form the word lines 10 and the other wirings 11. FIG. 8 shows the state where the wiring layer 7 is etched and the patterned photoresist layer 9 is exfoliated. It is apparent from FIG. 8 that the wirings in all the areas containing the vicinity of the step portion could be patterned as designed.

In the above embodiment, the wirings are formed at both the upper and lower portions in the vicinity of the step portion. However, in the present invention, the wirings may be formed at only one of the upper and lower portions in the vicinity of the step portion. In the present invention, the patterning of the photoresist layer may be conducted with a reduction projection optical system instead of 1× magnification projection optical system.

What is claimed is:

1. A method for manufacturing a semiconductor device having a step portion at which discontinuity in height is formed by upper and lower portions adjacent to each other, and wirings which are formed on a surface of an area containing vicinity of said step portion and a flat portion positioned away from said step portion, comprising the steps of:

forming a wiring layer on the surface of the area containing vicinity of said step portion and said flat portion;

forming a photoresist layer on said wiring layer;

patterning said photoresist layer by using a photomask to form a photoresist pattern corresponding to said wirings; and etching said wiring layer by using said photoresist pattern to remove an exposed portion of said wiring layer and form said wirings, wherein said photomask has a first mask pattern corresponding to said photoresist pattern formed in said vicinity of said step portion at at least one of upper and lower portion sides of said step portion and a second mask pattern corresponding to said photoresist pattern formed in said flat portion, said first mask pattern having a dimension larger than a corresponding value of a predetermined dimension of corresponding wirings, said second mask pattern having a dimension equal to a corresponding value of a predetermined dimension of corresponding wirings.

2. The method as claimed in claim 1, wherein a thickness of said photoresist layer in said vicinity of said step portion at the upper portion side of said step portion is smaller than that in said flat portion while a thickness of said photoresist layer in said vicinity of said step portion at the lower portion side of said step portion is larger than that in said flat portion.

3. The method as claimed in claim 2, wherein a value of a resolution limit sensitivity of a photoresist in the thickness of said photoresist layer in said vicinity of said step portion at the upper and lower portion sides of said step portion is smaller than that of a photoresist in the thickness of said photoresist layer in said flat portion.

* * * * *